United States Patent
Korthuis

(10) Patent No.: US 6,566,266 B2
(45) Date of Patent: May 20, 2003

(54) METHOD OF POLISHING A LAYER COMPRISING COPPER USING AN OXIDE INHIBITOR SLURRY

(75) Inventor: Vincent C. Korthuis, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/193,368

(22) Filed: Jul. 11, 2002

(65) Prior Publication Data

US 2003/0017703 A1 Jan. 23, 2003

Related U.S. Application Data

(60) Provisional application No. 60/305,854, filed on Jul. 18, 2001.

(51) Int. Cl.[7] .................................. H01L 21/302
(52) U.S. Cl. ................. 438/691; 438/705; 438/692; 438/784
(58) Field of Search ................. 438/784, 751, 438/753, 741, 691, 692, 705, 704

(56) References Cited

U.S. PATENT DOCUMENTS 5,897,375 A * 4/1999 Watts et al. ............... 438/693
6,181,013 B1 * 1/2001 Liu et al. .................. 257/762
6,368,955 B1 * 4/2002 Easter et al. ............... 438/633
2002/0061715 A1 * 5/2002 Uzoh et al. ................. 451/41

\* cited by examiner

Primary Examiner—Michael S. Lebentritt
Assistant Examiner—Bradley Smith
(74) Attorney, Agent, or Firm—Peter K. McLarty; W. James Brady, III; Frederick J. Telecky, Jr.

(57) ABSTRACT

A process for polishing a semiconductor body according to an embodiment of the present invention includes the steps of providing a semiconductor body, forming a barrier layer over a portion of the semiconductor body, and forming at least one layer including copper over a portion of the barrier layer. The process further includes the steps of polishing at least a portion of the layer including copper with a first polishing slurry composition and changing the polishing composition from the first slurry composition to a second polishing slurry composition. The process also includes the steps of polishing at least a portion of the layer including copper with the second slurry composition and polishing at least a portion of the barrier layer with the second slurry composition. Moreover, the second slurry composition includes an effective amount of a copper oxide inhibitor to substantially inhibit copper oxide formation. In an embodiment, the effective amount of the copper oxide inhibitor is between about 0.005% and 0.03% by weight of the second slurry composition. In another embodiment, the second slurry composition is different than the first slurry composition.

9 Claims, 5 Drawing Sheets

METHOD OF POLISHING A LAYER COMPRISING COPPER USING AN OXIDE INHIBITOR SLURRY

This application claims priority under 35 USC §119(e)(1) of provisional application No. 60/305,854 filed Aug. 18, 2001.

BACKGROUND OF THE INVENTION

1. Field of the Invention

The present invention relates generally to the field of copper-coated semiconductor devices. Specifically, the invention relates to chemical-mechanical processes for polishing a copper-coated semiconductor device.

2. Description of Related Art

Some known chemical-mechanical processes for polishing a semiconductor body include forming a dielectric layer over the semi-conductor body, etching a plurality of trenches into the dielectric layer, and forming a barrier layer over the dielectric layer and the trenches. These known processes also include forming a copper seed level over the barrier layer and forming a copper level over the copper seed level, such that a portion of the copper seed layer and a portion of the copper level also are disposed in the trenches. In these known processes, the copper layer, the copper seed layer, and the barrier layer may be removed by a polishing pad, which may include a slurry composition disposed on the side of the polishing pad which contacts the various layers. Moreover, during the initial polishing, e.g., the polishing of the copper layer and the copper seed layer, these known processes rapidly may remove the copper layers by using a high selectivity copper-polishing slurry, e.g., a slurry which may rapidly remove the copper layer in order to maintain a high throughput. However, after the high selectivity slurry removes the copper layers and the barrier layer, the copper layer disposed inside the trenches also may become polished with the high selectivity copper-polishing slurry. This over-polishing of the copper layer disposed inside the trenches causes a depression of the copper layer, such that the copper layer becomes uneven, an effect which is known as dishing.

SUMMARY OF THE INVENTION

Therefore, a need has arisen for processes that overcome these and other shortcomings of the related art. A technical advantage of the present invention is that the copper layer, or copper layers, rapidly may be removed during the chemical-mechanical polishing process. Another technical advantage of the present invention is that a copper oxide inhibitor is added to the slurry composition during the polishing process, such that when the slurry composition contacts the copper layer disposed inside the trenches, oxidation of the copper layer is reduced or eliminated, which decreases dishing.

In an embodiment of the present invention, a process for polishing a semiconductor body is described. The process includes the steps of providing a semiconductor body, forming a barrier layer over at least a portion of the semiconductor body, and forming at least one layer comprising copper over at least a portion of the barrier layer. The process further includes the steps of polishing at least a portion of the at least one layer comprising copper with a first polishing slurry composition and changing the polishing slurry composition from the first slurry composition to a second polishing slurry composition. The process also includes the steps of polishing at least a portion of the layer comprising copper with the second slurry composition and polishing at least a portion of the barrier layer with the second slurry composition. Moreover, the second slurry composition comprises an effective amount of a copper oxide inhibitor to substantially inhibit copper oxide formation. The effective amount of the copper oxide inhibitor may be greater than about 0.005% by weight of the second slurry composition. Alternatively, the effective amount may be between about 0.005% and 0.03% by weight of the second slurry composition. Moreover, the second slurry composition may be different than the at least one first slurry composition.

In another embodiment of the present invention, a process- for polishing a semiconductor body is described. The process includes the steps of providing a semiconductor body, forming a dielectric layer over the semiconductor body, and etching a plurality of trenches in the dielectric layer. The process also includes the steps of forming a barrier layer over the dielectric layer and the trenches, forming a copper seed layer over the barrier layer, and forming a copper layer over at least a portion of the copper seed layer. The process further includes the steps of polishing at least a portion of the copper layer with a first polishing slurry composition and changing the polishing composition from the first slurry composition to a second polishing slurry composition. The process also includes the steps of polishing at least a portion of the copper layer with the second slurry composition and polishing at least a portion of the barrier layer with the second slurry composition. Moreover, the second slurry composition comprises an effective amount of a copper oxide inhibitor to substantially inhibit copper oxide formation. The effective amount of the copper oxide inhibitor may be greater than about 0.005% by weight of the second slurry composition. Alternatively, the effective amount may be between about 0.005% and 0.03% by weight of the second slurry composition. Moreover, the second slurry composition may be different than the at least one first slurry composition.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and the features and advantages thereof, reference now is made to the following descriptions taken in connection with the accompanying drawings.

DETAILED DESCRIPTION OF PREFERRED EMBODIMENTS

Preferred embodiments of the present invention and their advantages may be understood by referring to FIGS. 1a–1e, 2a–2g, and 3a–3e, like numerals being used for like corresponding parts in the various drawings.

Referring to FIGS. 1a–1e, 2a–2g, and 3a–3e, a process for polishing a semiconductor body according to several embodiments of the present invention are described. In step 302, a semiconductor body 102 is provided, and in step 308, a barrier layer 110 may be formed over at least a portion of semiconductor body 102. Barrier layer 110 may comprise Ta, TaN, $Ta_2N$, TiN, W2N, Ta, Si, N, or any other materials suitable for use with copper, or the like, and any combinations thereof. Moreover, at least a portion of barrier layer 110 may be in direct contact with semiconductor body 102.

Figure 1A:
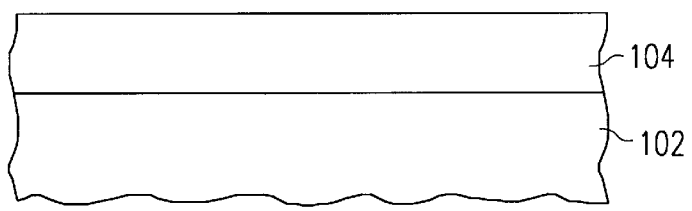
FIGS. 1a–1e are cross-sectional schematics depicting a system employing a process for polishing a semiconductor body according to a first embodiment of the present invention.
Figure 1B:
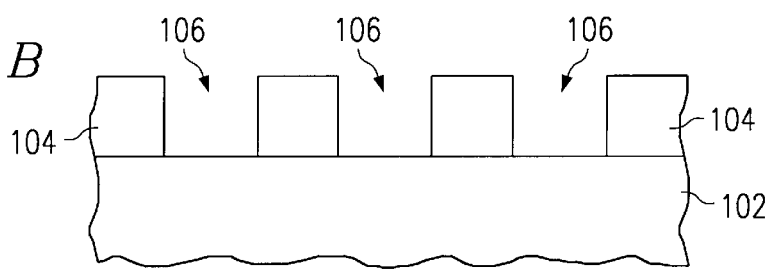
Figure 1C:
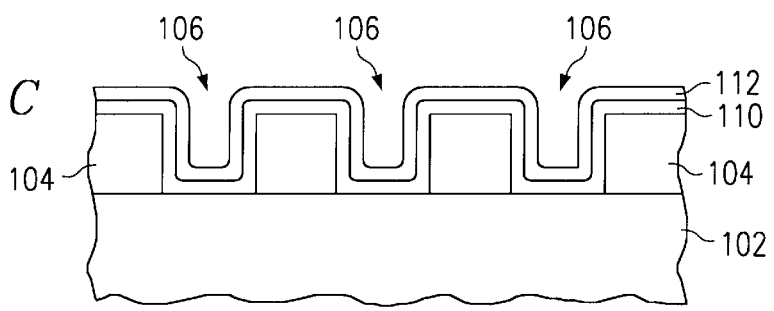
Figure 1D:
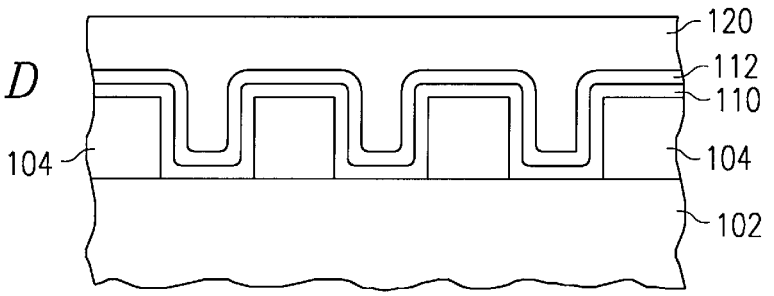
Figure 1E:
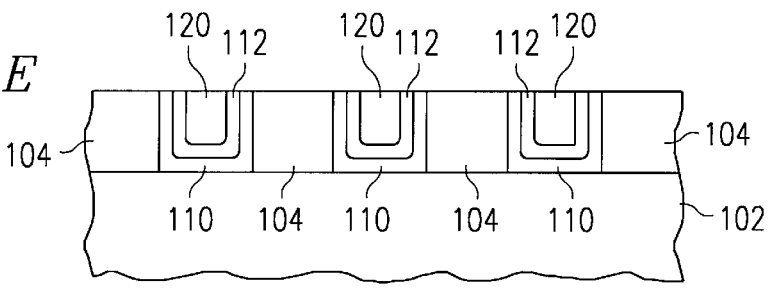
Figure 2A:
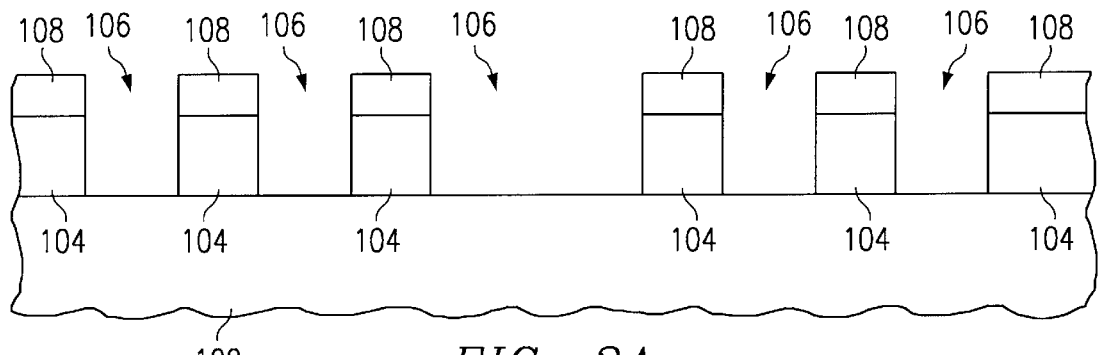
FIGS. 2a–2g are cross-sectional schematics depicting a system employing a process for polishing a semiconductor body according to a second embodiment of the present invention.
Figure 2B:
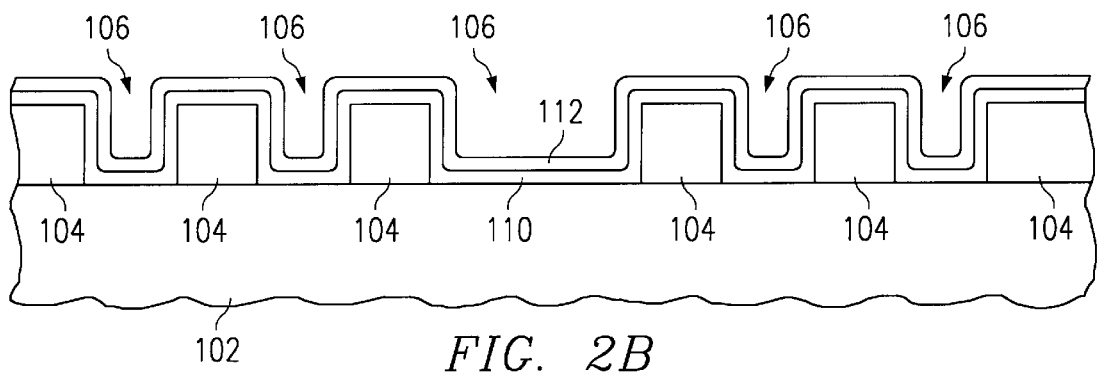
Figure 2C:
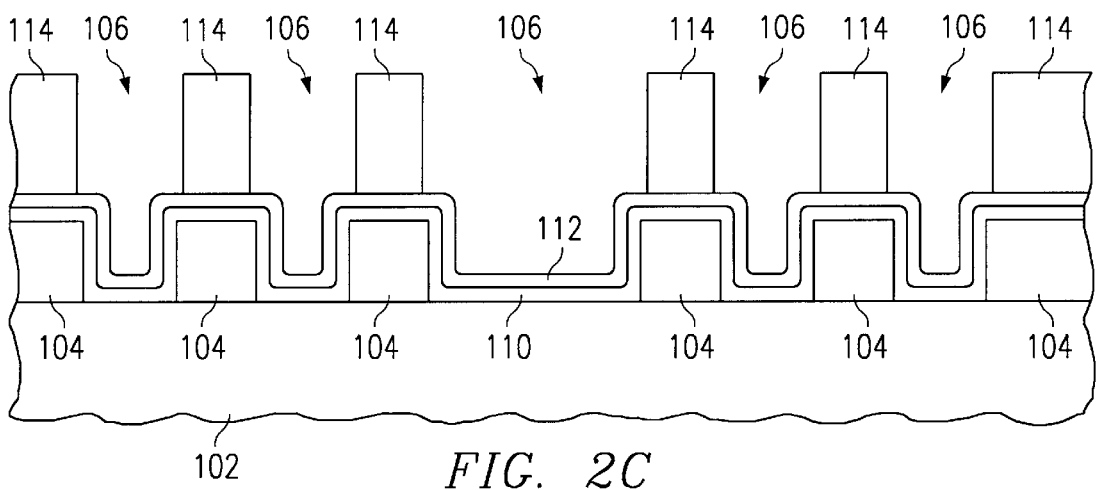
Figure 2D:
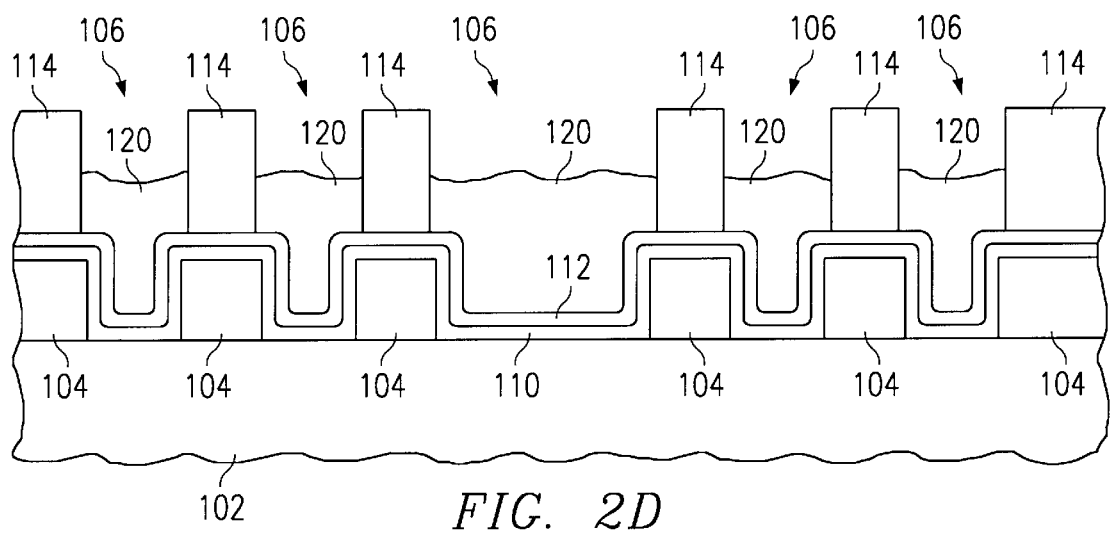
Figure 2E:
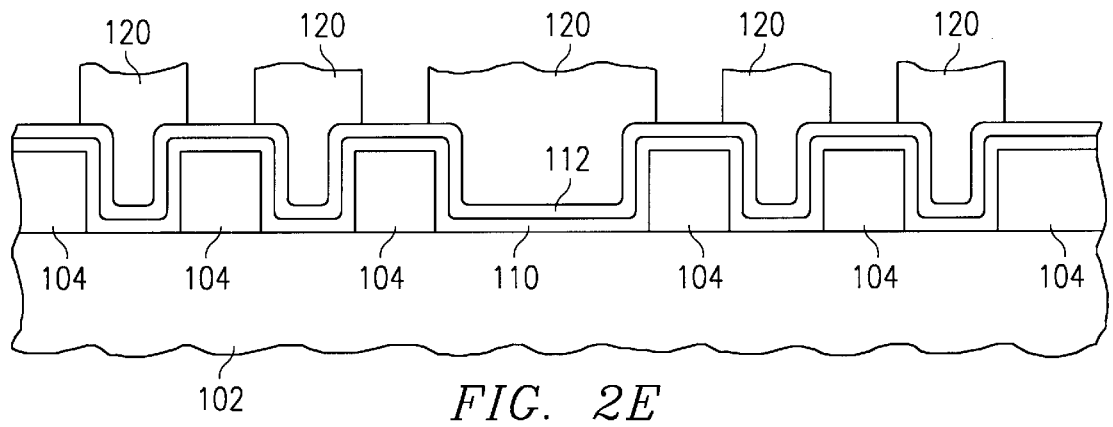
Figure 2F:
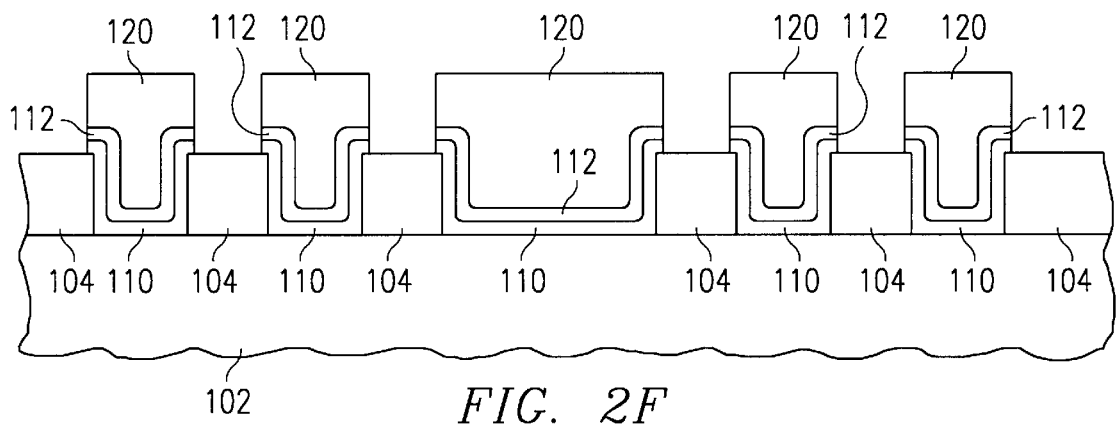
Figure 2G:
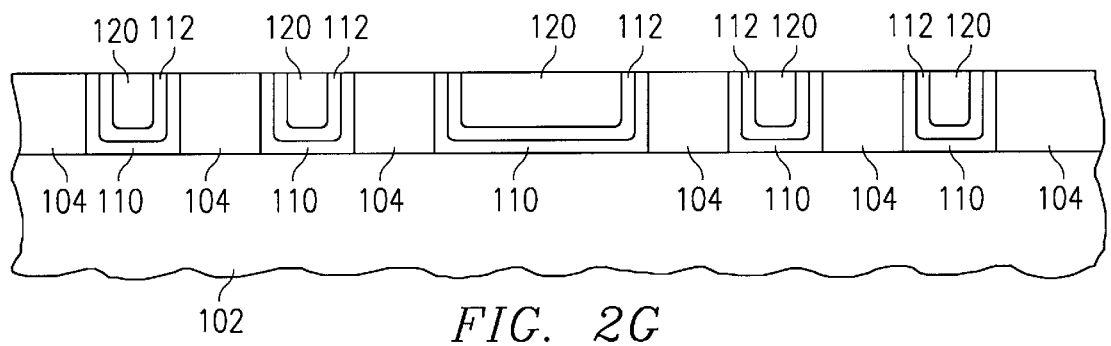
Figure 3A:
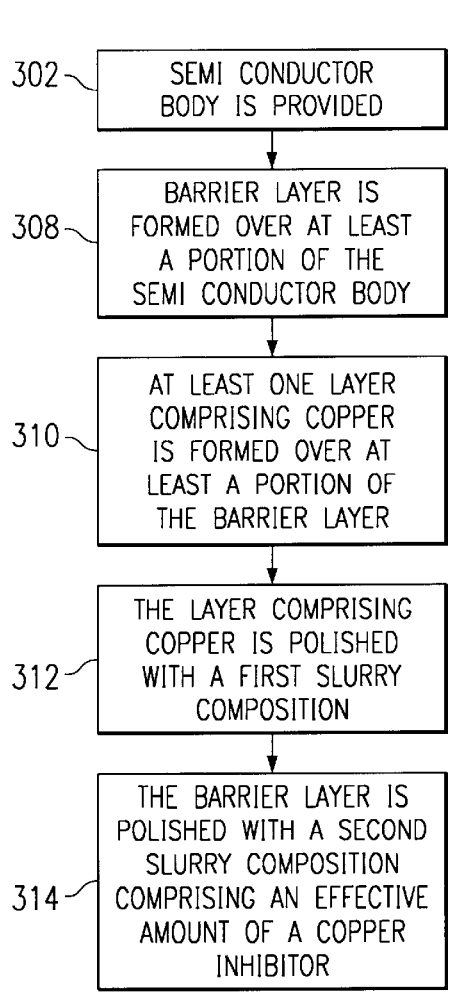
FIG. 3a is a process for polishing a semiconductor body according to a third embodiment of the present invention.
Figure 3B:
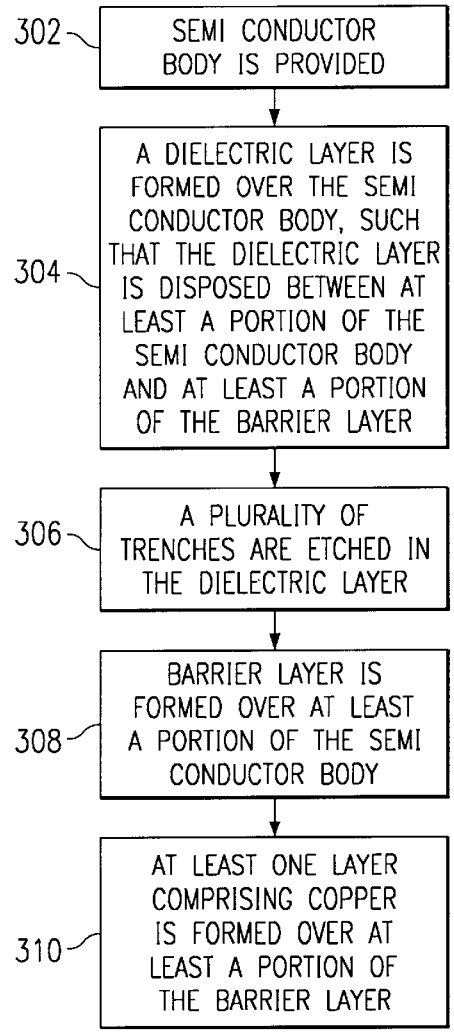
FIG. 3b is a process for polishing a semiconductor body according to a fourth embodiment of the present invention.

Referring to FIG. 3b, in an alternative embodiment, the process also may include steps 304 and 306. In step 304, a dielectric layer 104 may be formed over semiconductor body 102, such that dielectric layer 104 may be disposed between at least a portion of semiconductor body 102 and at least a portion of barrier layer 110. Dielectric layer 104 may comprise oxides, such as silicon-dioxide, flourine-doped silicate glass, or any other low-dielectric constant materials, or the like, and any combinations thereof. In one embodiment, dielectric layer 104 may be formed along and may be in direct contact with semiconductor body 102 along the entire length of semiconductor body 102. In step 306, a plurality of trenches 106 may be etched in dielectric layer 104 using dielectric trench pattern 108, such that dielectric layer 104 no longer may be formed along the entire length of semiconductor body 102. Dielectric trench pattern 108 may comprise a photosensitive material, such as photoresist, or the like. Moreover, trenches 106 may be etched in areas where interconnect lines or structures may be disposed. In step 308, barrier layer 110 may be formed over dielectric layer 104 and trenches 106, such that barrier layer 110 may be in direct contact with semiconductor body 102 via trenches 106.

Figure 3C:
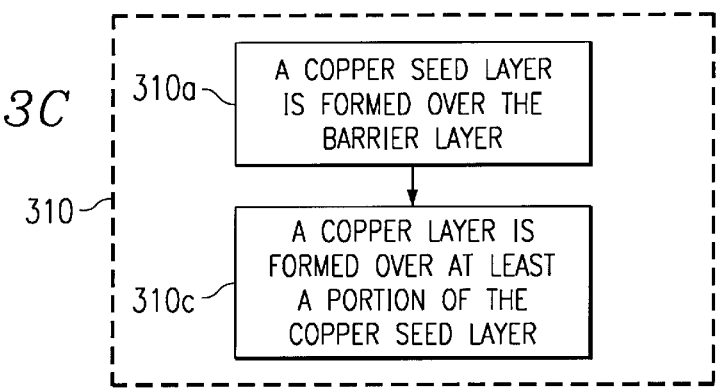
FIG. 3c is a process for polishing a semiconductor body according to a fifth embodiment of the present invention.

In each of the above described embodiments, in step 310, at least one layer comprising copper may be formed over at least a portion of barrier layer 110. Referring to FIG. 3c, step 310 may comprise steps 310a and 310c. In this embodiment, instep 310a, a copper seed layer 112 may be formed over barrier layer 110, such that at least a portion of copper seed layer 112 may be disposed within trenches 106. In step 310c, a copper layer 120 may be formed over copper seed layer 112, such that at least a portion of copper layer 120 also may disposed within trenches 106.

Figure 3D:
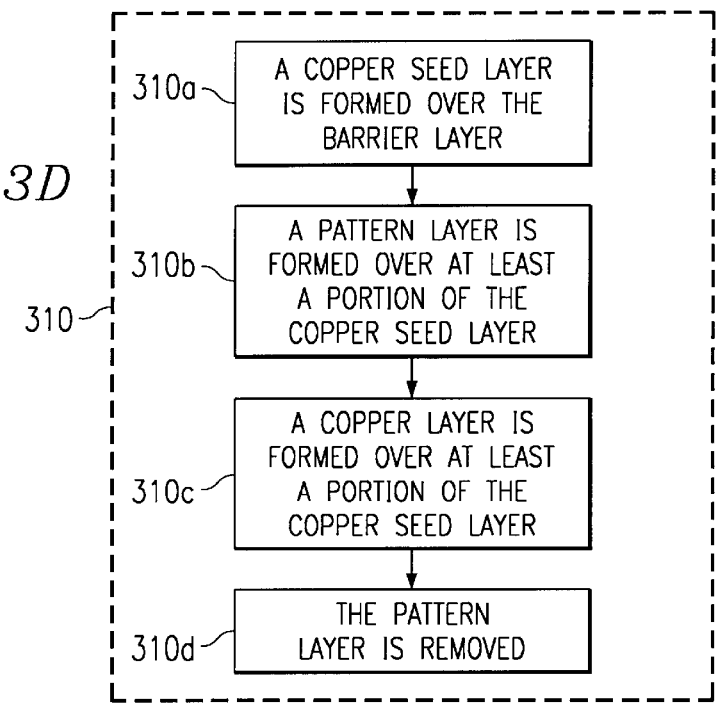
FIG. 3d is a process for polishing a semiconductor body according to a sixth embodiment of the present invention.

Referring to FIG. 3d, step 310 further may comprise steps 310b and 310d. In this embodiment, in step 310a, a copper seed layer 112 may be formed over barrier layer 110, such that at a least portion of copper seed layer 112 may be disposed within trenches 106. In step 310b, a pattern layer 114 may be formed over at least a portion of copper seed layer 112. Specifically, pattern layer 114 may formed over those portions of copper seed layer 112 which are not disposed within trenches 106. In step 310c, copper layer 120 may be formed over at least a portion of copper seed layer 112, such that at least a portion of copper layer 120 also may be disposed within trenches 106. Specifically, copper layer 120 may be formed over those portions of copper seed layer 112 which are disposed within trenches 106. In step 310d, pattern layer 114 may be removed, which may expose those portions of copper seed layer 112 which are not disposed within trenches 106.

Figure 3E:
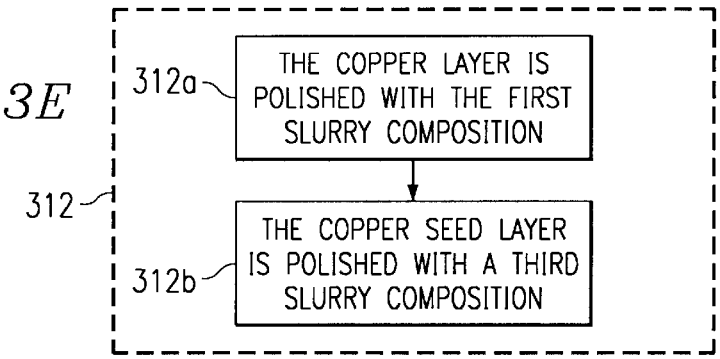
FIG. 3e is a process for polishing a semiconductor body according to a seventh embodiment of the present invention.

In each of the above described embodiments, in step 312, the at least one layer comprising copper initially may be polished with a first slurry composition. Referring to FIG. 3e, step 312 may comprise steps 312a and 312b. In step 312a, copper layer 120 initially may be polished with the first slurry composition. The first slurry composition may be any high selectivity copper slurry, e.g., a slurry which may rapidly remove the copper layer in order to maintain a high throughput, which is known in the art. Moreover, the polishing of copper layer 120 with the first slurry composition may oxidize copper layer 120. Oxidizing copper layer 120 more readily may allow a polishing pad to polish away or remove those portions of copper layer 120 which are not disposed within trenches 106 via mechanical abrasion. In another embodiment, in step 312b, copper seed layer 112 also may be polished with the first slurry composition. However, in each of the above described embodiments, a rate of polish for copper layer 120 may vary along the length of copper layer 120. Specifically, a first portion of copper layer 120 may be substantially polished away before a second portion of copper layer 120 is substantially polished away. Consequently, the portion of copper seed layer 112 formed underneath the first portion of copper layer 120, initially may be polished before the portion of copper seed layer 112 formed underneath the second portion of copper layer 120.

In each of the above described embodiments, the process further may include step 314. In step 314, an effective amount of a copper inhibitor may be added to the slurry composition used to polish away the layers formed over semiconductor body 102, such that the polishing slurry composition may change from the first slurry composition to a second slurry composition. For example, copper layer 120 and copper seed layer 112 may have a first reflectivity and barrier layer 110 may have a second reflectivity, which may be different than the first reflectivity. When the portion of copper seed layer 112 formed underneath the first portion of copper layer 120 is polished away, a portion of barrier layer 110 may become exposed. Moreover, because barrier layer 110 may have the second reflectivity, which may be different than the first reflectivity, a laser (not shown) may detect the reflectivity change and the polishing slurry composition may be changed from the first slurry composition to the second slurry composition. The second slurry composition then may be used to polish away the remaining unpolished portions of copper layer 120 and copper seed layer 112, along with barrier layer 110. Alternatively, the polishing slurry composition may be changed from the first slurry composition to the second slurry composition after a predetermined length of time. For example, the predetermined length of time may be a length of time sufficient to substantially remove copper layer 120 and copper seed layer 112, without substantially removing barrier layer 110.

In each of the above described embodiments, the process further may include step 316. In step 316, the second slurry composition may be used to remove those portions of the at least one layer comprising copper which still remain after the polishing slurry composition is changed from the first slurry composition to the second slurry composition. Moreover, in step 316, as portions of the layer comprising copper are removed, portions of barrier layer 110 formed underneath the layer comprising copper may become exposed and subsequently polished away with the second slurry composition. Once the layer comprising copper and barrier layer 110 are substantially removed, the polishing process then may be complete.

In each of the above described embodiments, the second slurry composition may comprise an effective amount of a copper oxide inhibitor to substantially inhibit copper oxidation. For example, the effective amount of the copper oxide inhibitor may be greater than about 0.005% by weight of the second slurry composition. Alternatively, the effective amount may be between about 0.005% and about 0.03% by weight of the second slurry composition. In another embodiment, the effective amount may be about 0.02% by weight of the second slurry composition. Moreover, for example, the copper oxide inhibitor may comprise benzotriazole or any other material, which may reduce or eliminate a rate of oxidation of copper. In addition, the second slurry composition may be different than the first slurry composition, e.g., the first slurry composition may not comprise the effective amount of the copper oxide inhibitor.

In operation, during step 312, a substantial portion of the at least one layer comprising copper may be removed using the first slurry composition. During step 316, the second slurry composition may be used to remove those portions of the layer comprising copper still remaining after the polishing slurry is changed from the first slurry composition to the second slurry composition during step 314. As portions of the layer comprising copper are removed, portions of barrier layer 110 may become exposed and polished away with the second slurry composition. However, the exposed portions of barrier layer 110 may be removed before subsequently exposed portions of barrier layer 110 are removed, which may expose a portion of copper layer 120 disposed in trench 106 to the second slurry composition. However, because the second slurry composition comprises the effective amount of the copper oxide inhibitor, the portion of copper layer 120 disposed within trenches 106 which is exposed to the second slurry composition may not be oxidized. Alternatively, the oxidation rate of copper layer 120 may be substantially less when exposed to the second slurry composition than when exposed to the first slurry composition. As such, copper layer 120 disposed in trenches 106 may not be readily removed by mechanical abrasion, and an amount of dishing of copper layer 120 may be substantially reduced or even may be eliminated.

While the invention has been described in connecting with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein.

What I claim is:

1. A process for polishing a semiconductor body, comprising the steps of:

providing a semiconductor body;

forming a barrier layer over at least a portion of said semiconductor body;

forming a copper seed layer over said barrier layer;

forming a pattern layer over at least a portion of said copper seed layer;

forming a copper layer over at least a portion of said copper seed layer, removing said pattern layer after said formation of said copper layer over at least a portion of said copper seed layer;

polishing at least a portion of said copper layer with a first polishing slurry composition;

changing said slurry polishing composition from said first slurry composition to a second polishing slurry composition;

polishing at least a portion of said at least one layer comprising copper with said second slurry composition; and polishing at least a portion of said barrier layer with said second slurry composition, wherein said second slurry composition comprises an effective amount of a copper oxide inhibitor to substantially inhibit copper oxide formation.

2. The process of claim 1, wherein said effective amount of said copper oxide inhibitor is greater than about 0.005% by weight of said second slurry composition.

3. The process of claim 1, wherein said effective amount of said copper oxide inhibitor is between about 0.005% and about 0.03% by weight of said second slurry composition.

4. The process of claim 1, wherein said effective amount of said copper oxide inhibitor is about 0.02% by weight of said second slurry composition.

5. The process of claim 3, wherein said copper oxide inhibitor comprises benzotriazole.

6. The process of claim 3, wherein said first slurry composition is different than said second slurry composition.

7. The process of claim 1 wherein a rate of oxidation of said copper layer when said copper layer is polished with said second slurry composition is less than a rate of oxidation of said copper layer when said copper layer is polished with said first slurry composition.

8. The process of claim 3, wherein the step of changing said polishing slurry composition from said first slurry composition to said second slurry composition further comprises the step of changing said polishing slurry composition from said first slurry composition to said second slurry composition after the expiration of a predetermined length of time.

9. The process of claim 3, wherein the step of changing said polishing slurry composition from said first slurry composition to said second slurry composition further comprises the step of changing said polishing slurry composition from said first slurry composition to said second slurry composition when at least a portion of said barrier layer is exposed from the removal of at least a portion of said at least one layer comprising copper.

* * * * *